(12) United States Patent
Buzaglo

(10) Patent No.: US 10,849,238 B1
(45) Date of Patent: Nov. 24, 2020

(54) REMOVABLE LID FOR IC REFLOW

(71) Applicant: Mellanox Technologies, Ltd., Yokneam (IL)

(72) Inventor: Yogev Buzaglo, Kiryat Ata (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 16/578,454

(22) Filed: Sep. 23, 2019

(51) Int. Cl.
| | |
|---|---|
| H05K 1/02 | (2006.01) |
| H05K 3/34 | (2006.01) |
| H05K 1/09 | (2006.01) |
| H01L 23/488 | (2006.01) |
| H05K 3/40 | (2006.01) |
| H05K 7/10 | (2006.01) |
| H05K 1/11 | (2006.01) |

(52) U.S. Cl.
CPC ......... *H05K 3/3436* (2013.01); *H01L 23/488* (2013.01); *H05K 1/0271* (2013.01); *H05K 1/09* (2013.01); *H05K 1/111* (2013.01); *H05K 3/4007* (2013.01); *H05K 7/1069* (2013.01)

(58) Field of Classification Search
CPC ...... H05K 3/3436; H05K 1/0271; H05K 1/09; H05K 1/111; H05K 3/4007; H01L 23/488
USPC ....................................................... 174/250
See application file for complete search history.

(56) References Cited

U.S. PATENT DOCUMENTS

| | | | |
|---|---|---|---|
| 5,862,588 A * | 1/1999 | Heim | B23K 1/012 29/840 |
| 7,026,582 B2 | 4/2006 | Goenka et al. | |
| 10,064,275 B1 | 8/2018 | Peretz et al. | |
| 2017/0092556 A1* | 3/2017 | Gustafson | H01L 23/49816 |
| 2018/0090411 A1* | 3/2018 | Cetegen | H01L 23/3733 |

* cited by examiner

*Primary Examiner* — Tremesha S Willis
(74) *Attorney, Agent, or Firm* — Kligler & Associates Patent Attorneys Ltd

(57) ABSTRACT

One embodiment includes a method for manufacturing an electronic apparatus, including bonding an integrated circuit (IC) die to a substrate to form an IC package using a first reflow process, which causes the substrate to warp, reversibly connecting a lid with the IC package over the IC die so that the lid applies a force to the IC die, providing a printed circuit board (PCB) including an array of first contact pads, respectively disposing an array of bonding elements on an array of second contact pads of the substrate, placing the IC package on to the PCB with respective ones of the bonding elements contacting respective ones of the first contact pads, performing a second reflow process to apply heat to the bonding elements to bond the first contact pads with the second contact pads, and removing the lid from the IC package after the second reflow process.

11 Claims, 11 Drawing Sheets

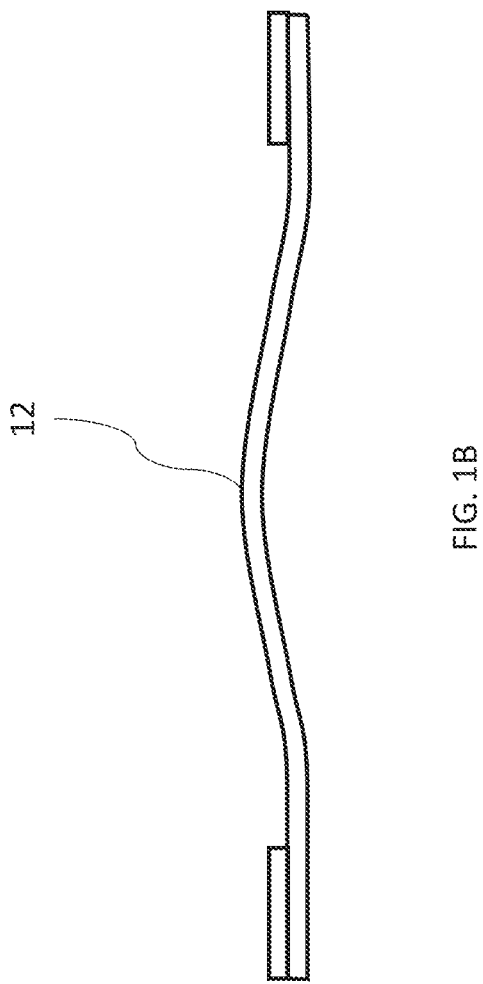

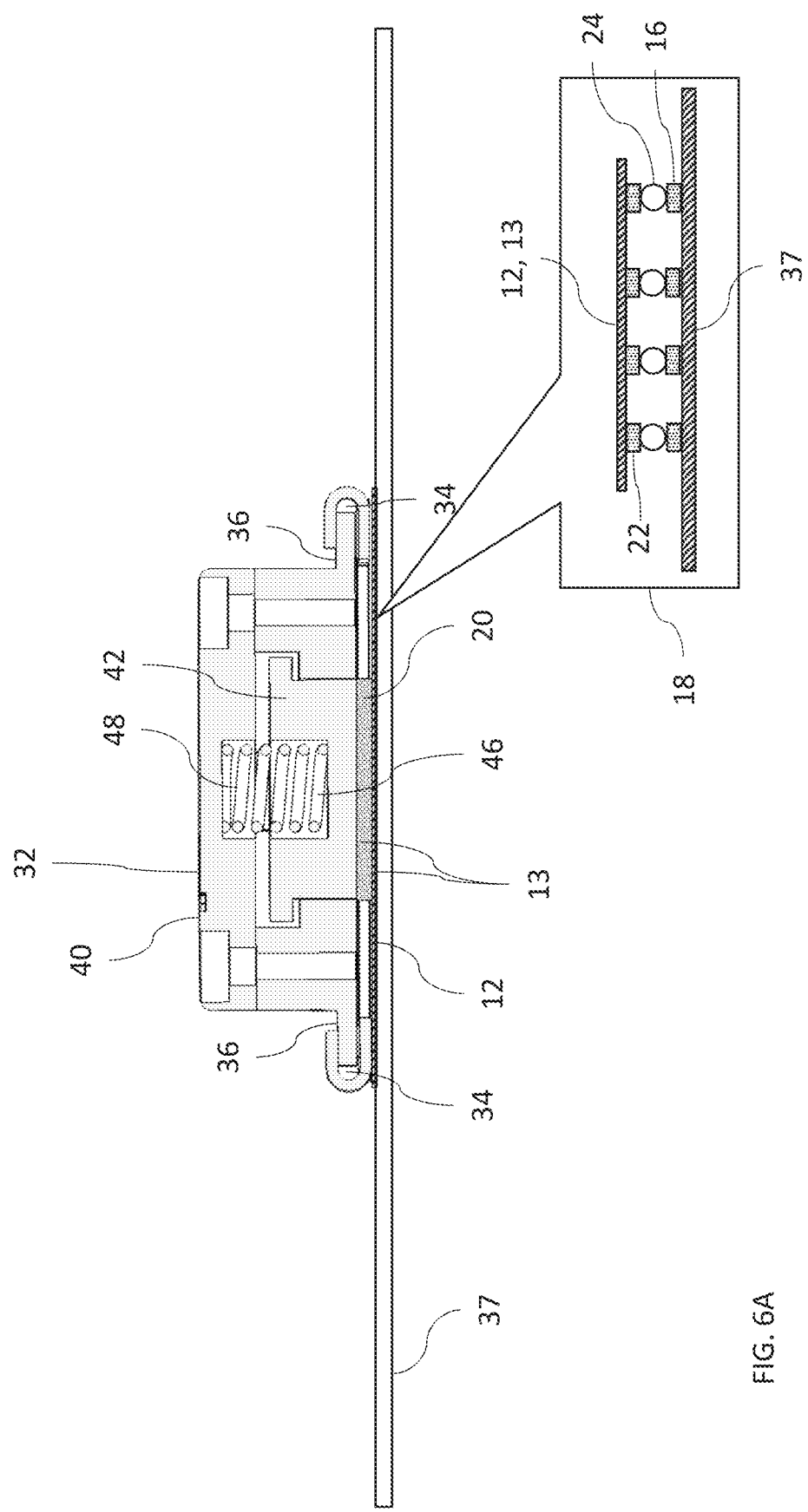

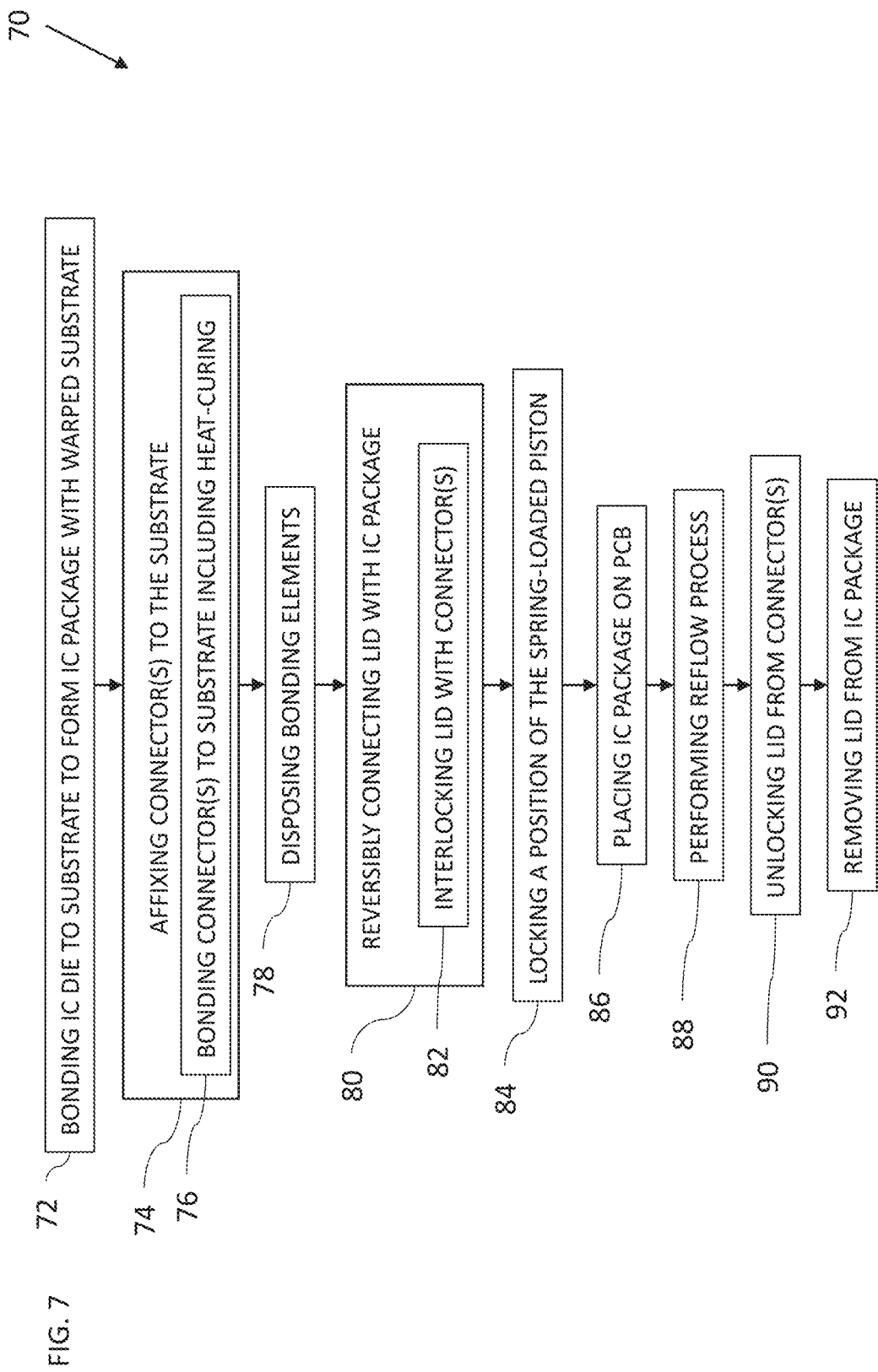

REMOVABLE LID FOR IC REFLOW

FIELD OF THE INVENTION

The present invention relates to electronic devices, and in particular, but not exclusively to, bonding an integrated circuit package to a printed circuit board.

BACKGROUND

Electronic systems may be assembled using various techniques, such as surface-mount technology (SMT), in which electronic components, such as a surface-mount device (SMD), are mounted directly on a printed circuit board (PCB) substrate using soldering techniques. In SMT, an array of solder balls attached to contacts of the SMD are aligned with a corresponding array of contacts on the PCB. The SMD and the PCB are thermally heated in a reflow process causing the solder balls to at least partially melt and bond the aligned contacts with each other, thereby bonding the SMD with the PCB.

U.S. Pat. No. 10,064,275 to Peretz, et al., describes a circuit board that includes a substrate and multiple pads. The multiple pads are disposed on the substrate and have respective footprints for connecting one or more electronic components to the circuit board, at least a pad from among the pads includes a linear electrical trace laid out in a two-dimensional pattern that covers at least a part of a footprint of the pad.

U.S. Pat. No. 7,026,582 to Goenka, et al., describes a system and method for reflowing lead-free solder to interconnect a plurality of electronic components to a substrate. The system includes an oven for preheating the substrate and the plurality of electronic components disposed thereon, and a supplemental heat source disposed in the oven for providing additional heat energy to reflow the solder.

SUMMARY

There is provided in accordance with an embodiment of the present disclosure, a method for manufacturing an electronic apparatus, including bonding an integrated circuit (IC) die to a substrate to form an IC package using a first reflow process, which causes the substrate to warp, reversibly connecting a lid with the IC package over the IC die so that the lid applies a force to the IC die, providing a printed circuit board (PCB) including an array of first contact pads, respectively disposing an array of bonding elements on an array of second contact pads of the substrate of the IC package, placing the IC package on to the PCB with respective ones of the bonding elements contacting respective ones of the first contact pads, performing a second reflow process to apply heat to the bonding elements to bond the first contact pads with the second contact pads, and removing the lid from the IC package after the second reflow process.

Further in accordance with an embodiment of the present disclosure, the method includes affixing at least one connector to the substrate, wherein the reversibly connecting includes interlocking the lid with the at least one connector using complementary reversibly interlocking features of the lid and the at least one connector, and the removing includes unlocking the lid from the at least one connector.

Still further in accordance with an embodiment of the present disclosure the interlocking includes rotating the lid with respect to the at least one connector in order to interlock the interlocking features together.

Additionally, in accordance with an embodiment of the present disclosure the affixing includes bonding the at least one connector to the substrate.

Moreover, in accordance with an embodiment of the present disclosure the bonding is performed using an epoxy-based adhesive, the method further including heat-curing the epoxy-based adhesive.

Further in accordance with an embodiment of the present disclosure the reversibly connecting includes a spring-loaded piston of the lid applying the force, which is perpendicular to a plane defined by the substrate, on the IC die.

Still further in accordance with an embodiment of the present disclosure, the method includes locking a position of the spring-loaded piston after the lid has been connected with the substrate.

There is also provided in accordance with another embodiment of the present disclosure, an electronic apparatus, including a printed circuit board with an array of first contact pads, an integrated circuit (IC) package including an IC die bonded to a substrate, which is warped, the substrate including an array of second contact pads and an array of bonding elements respectively disposed on the array of second contact pads, the IC package being placed on to the PCB with respective ones of the bonding elements contacting respective ones of the first contact pads, and a lid configured to reversibly connect with the IC package over the IC die so that the lid applies a force to the IC die, and be removed from the IC package.

Additionally, in accordance with an embodiment of the present disclosure, the apparatus includes at least one connector affixed to the substrate, wherein the at least one connector and the lid include complementary reversibly interlocking features configured to interlock the lid with the at least one connector, and unlock the lid from the at least one connector.

Moreover, in accordance with an embodiment of the present disclosure, the apparatus includes a frame including the at least one connector.

Further in accordance with an embodiment of the present disclosure the interlocking features are configured to allow reversible connection of the lid with the at least one connector by rotating the lid with respect to the at least one connector in order to interlock the interlocking features together.

Still further in accordance with an embodiment of the present disclosure the at least one connector is bonded to the substrate.

Additionally, in accordance with an embodiment of the present disclosure the at least one connector is bonded to the substrate using an epoxy-based adhesive.

Moreover, in accordance with an embodiment of the present disclosure the lid includes a spring-loaded piston configured to apply the force, which is perpendicular to a plane defined by the substrate, on the IC die.

Further in accordance with an embodiment of the present disclosure the lid includes a locking element configured to lock a position of the spring-loaded piston after the lid has been reversibly connected with the substrate.

Still further in accordance with an embodiment of the present disclosure the locking element includes a screw thread configured to adjust an abutment of the locking element with the spring-loaded piston.

Additionally, in accordance with an embodiment of the present disclosure the lid includes a surface which is at least partially painted with a paint which is darker than the surface.

BRIEF DESCRIPTION OF THE DRAWINGS

The present invention will be understood from the following detailed description, taken in conjunction with the drawings in which:

FIG. 1B is a cross-section view of the electronic apparatus of FIG. 1A along line B:B;

FIG. 6A is a cross-sectional view of the lid interlocked with the IC package along line A:A of FIG. 5B;

FIG. 7 is a flow chart including steps in a method of manufacturing an electronic apparatus in accordance with an embodiment of the present invention;

DESCRIPTION OF EXAMPLE EMBODIMENTS

Overview

Figure 1A:
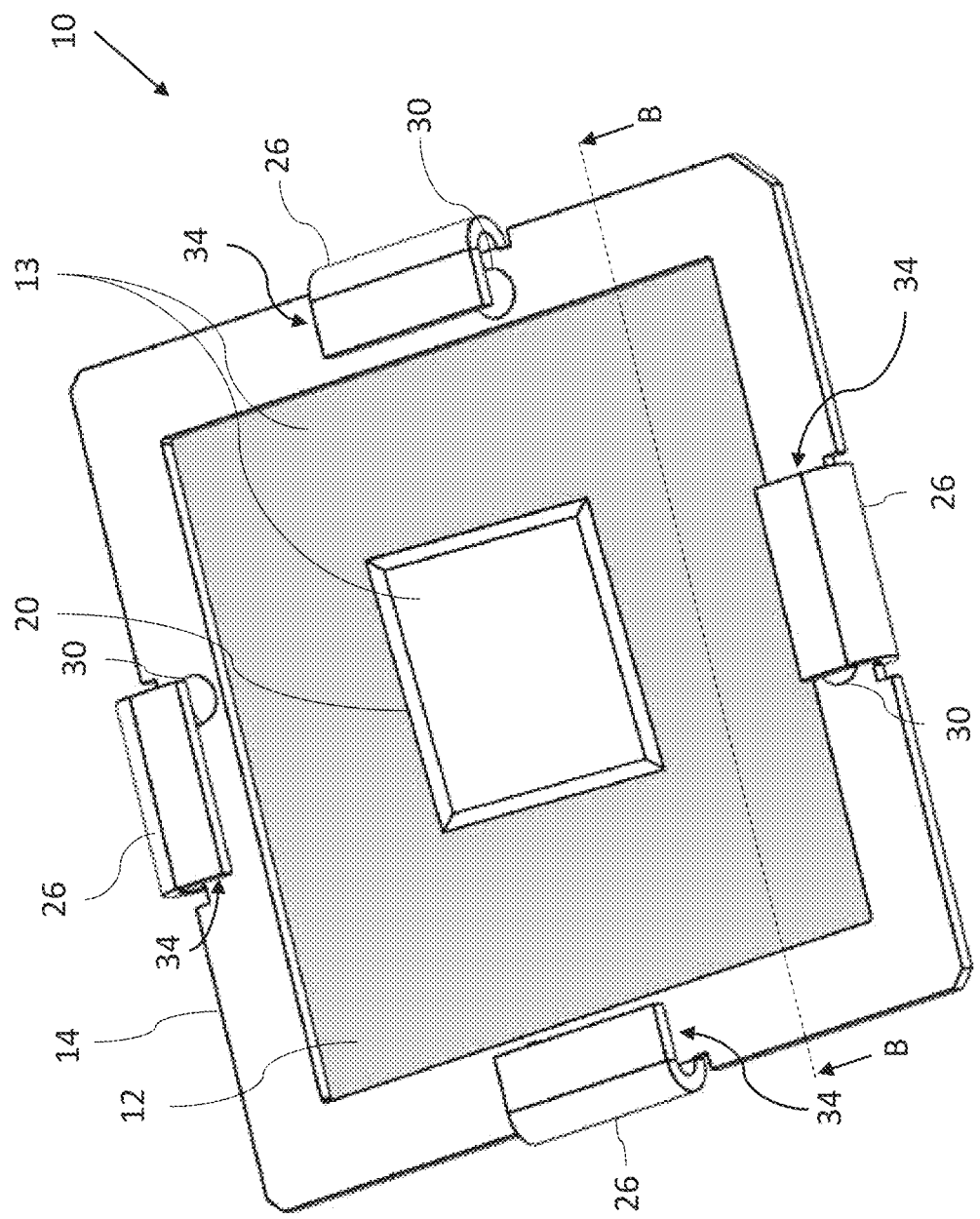
FIG. 1A is a schematic view of an electronic apparatus with a frame constructed and operative in accordance with an embodiment of the present invention.

During a reflow process to bond an integrated circuit (IC) die to a substrate to form an IC package, there may be a mismatch between the coefficient of thermal expansion of the IC die and the substrate leading to warpage of the substrate (e.g., upwards warpage of the center of the substrate with respect to the sides of the substrate). The warpage may be problematic for many reasons, including damage to the IC die and/or the substrate as well as preventing future connection of the substrate of the IC package with a printed circuit board (PCB).

For example, a substrate having a width and length of 40 mm may have a warpage of around 700 microns after reflow. The warpage is measured as the vertical distance (perpendicular to the surface of the substrate) from the center of the substrate to the side of the substrate. Depending upon the implementation, the warpage needs to be reduced, for example to less than 8 mils, which is about 203 microns, to connect the IC package with the PCB.

One solution to the problem of warpage is to place a copper lid over the IC die after the reflow process and attach edges of the lid to outer edges of the substrate so that the copper lid applies a force on the substrate and IC die to reduce the warpage. Although the copper lid may sufficiently solve the warpage problem, the copper lid creates another problem. During use, the copper lid interferes with cooling of the IC die even if a suitable thermal interface is placed between the IC die and the copper lid. For example, there may be a temperature gradient between the IC die and the top of the copper lid of about 10 degrees, depending on the specification of the IC die, the copper lid, and the thermal interface.

Embodiments of the present invention solve the above problems by providing a lid which is reversibly connected to the substrate of the IC package and applies a force to the IC die thereby at least partially reversing the warpage caused by the first reflow process used to form the IC package. The lid remains connected to the substrate during a second reflow process for bonding the substrate of the IC package to a PCB. The lid is removed from the substrate after the second reflow process thereby allowing sufficient cooling of the IC die during use.

In some embodiments, the lid may be reversibly connected to the substrate via one or more connectors which have been previously affixed (for example, bonded using a heat-cured epoxy-based adhesive) to the substrate. The connector(s) may be arranged on a frame which is affixed to the substrate.

The lid may be interlocked with the connector(s) using complementary reversibly interlocking features of the lid and the connector(s). The interlocking may include rotating the lid with respect to the connector(s) in order to interlock the interlocking features together. Removing the lid includes unlocking the lid from the connector(s), e.g., by rotating the lid with respect to the connector(s).

The lid generally applies a force to the top of the IC die to at least partially reverse the warpage caused during the first reflow process. The force may be applied by using a spring-loaded piston comprised in the lid. The piston applies a downwards force, which is perpendicular to a plane defined by the substrate, on the IC die. The force may be any suitable value for example up to 200 Newtons or higher in some implementations. In some embodiments, the lid may comprise a piston which is adjusted with respect to the IC die using a screw, for example.

During the second reflow process, the spring-loaded piston may continue to apply a downward force on the IC die leading to downwards warpage of the center of the substrate. Therefore, in some embodiments, the lid comprises a locking element, which may include a screw thread configured to adjust an abutment of the locking element with the spring-loaded piston. The locking element allows locking the longitudinal position of the spring-loaded piston after the lid has been connected with the substrate and prior to performing the second reflow process.

The frame and lid may be made from any suitable material, such as steel, aluminum, carbon-based, or ceramic based, which can be subjected to the temperature of the reflow process(es).

In some embodiments, at least some of the outer surface of the lid is coated with a dark color paint (e.g., black paint) to facilitate absorption of heat during the second reflow process.

System Description

Reference is now made to FIG. 1A, which is a schematic view of an electronic apparatus 10 comprising a substrate 12 with a frame 14 constructed and operative in accordance with an embodiment of the present invention. The electronic apparatus 10 also includes an integrated circuit (IC) die 20. The substrate 12 includes an array of contact pads (not shown), which are typically created during etching of a copper layer of the substrate 12. The integrated circuit (IC) die 20 also includes an array of contact pads (not shown) and an array of bonding elements (not shown), for example, solder balls or any suitable heat-activated bonding elements, respectively disposed on the array of contact pads of the IC die 20. The IC die 20 is placed on to the substrate 12 with respective ones of the bonding elements contacting respective ones of the contact pads of the substrate 12 (e.g., for flip-chip mounting). The IC die 20 is bonded to the substrate 12 to form an IC package 13 using a first reflow process, which causes the substrate to warp.

Reference is now made to FIG. 1B, which is a cross-section view of the electronic apparatus 10 of FIG. 1A along line B:B. FIG. 1B illustrates how the substrate 12 has become warped during the first reflow process.

Reference is again made to FIG. 1A. The electronic apparatus 10 also includes one or more connectors 26 affixed to the substrate 12. The connector(s) 26 are used to reversibly connect a lid to the substrate 12 as will be described in more detail with reference to FIGS. 2-12. In some embodiments, as shown in FIG. 1A, the connector(s) 26 may be comprised in the frame 14 which is affixed to the substrate 12. In other embodiments, the connector(s) 26 may be affixed directly to the substrate 12 without using the frame 14.

The connector(s) 26 and/or the frame 14 may be affixed to the substrate 12 using any suitable method. For example, the connector(s) 26 and/or the frame 14 may be bonded to the substrate 12 using an epoxy-based adhesive or any suitable adhesive, which may optionally be heat-cured for extra strength. The frame 14 and/or the connector(s) 26 may be formed from any suitable material, for example, a metal such as steel or aluminum, or a carbon-based or ceramic-based material, or any suitable combination thereof, which is strong enough to withstand the temperatures used during a second reflow process (e.g., 260 degrees Centigrade) bonding the substrate 12 to a printed circuit board (described in more detail with reference to FIGS. 6A and 7) The frame 14 shown in FIG. 1A includes four connectors 26. Each of the four connectors 26 includes a receptacle 34 for receiving and securing part of the lid therein, as will be described in more detail with reference to FIGS. 2-12. Each connector 26 includes a protrusion 30 configured to prevent further rotation of the lid within the frame 14 once the lid has been locked in the frame 14, as will be described in more detail with reference to FIGS. 2-12.

The electronic apparatus 10 of FIG. 1A shows a single IC die 20. In some embodiments, the electronic apparatus 10 may include multiple IC dies disposed on the substrate 12.

Figure 2A:
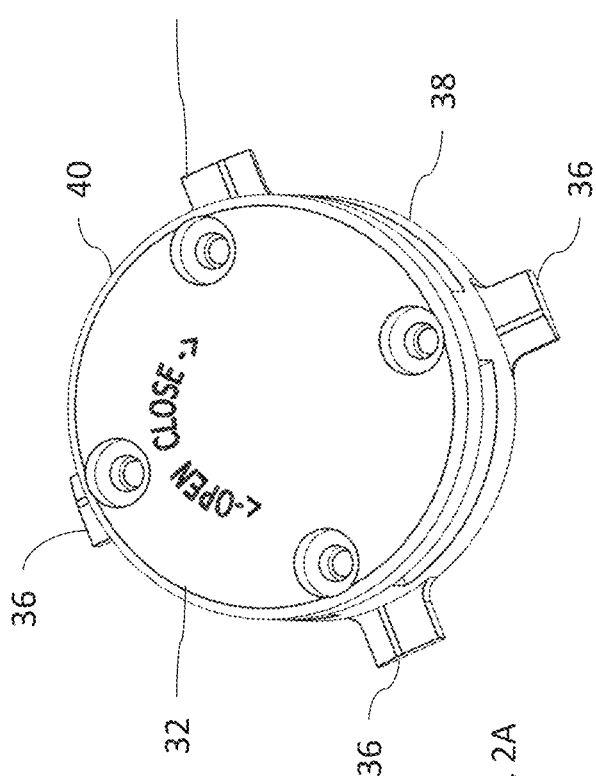
FIGS. 2A-B are schematic views of a lid constructed and operative in accordance with an embodiment of the present invention.
Figure 2B:
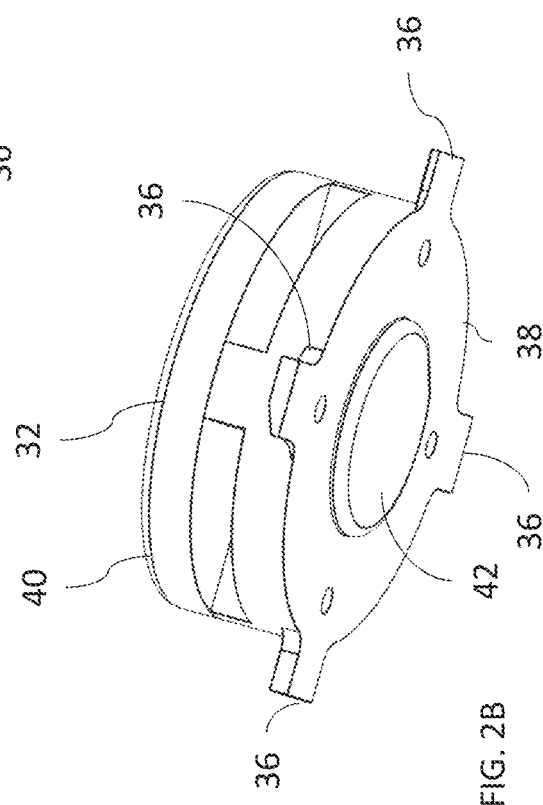

Reference is now made to FIGS. 2A-B, which are schematic views of a lid 32 constructed and operative in accordance with an embodiment of the present invention. The electronic apparatus 10 of FIG. 1A also includes the lid 32 which is configured to reversibly connect with the substrate 12 (FIG. 1A) over the IC die 20 (FIG. 1A) so that the lid 32 applies a force to the IC die 20 (to at least partially reduce the warpage caused by the first reflow process) and configured to be removed from the substrate 12, as will be described in more detail with reference to FIGS. 5, 6A-B, after the second reflow process. The lid 32 includes a base 38, a cover 40, and a piston 42, disposed between the base 38 and the cover 40. The piston 42 of the lid 32 applies a force to the IC die 20, as will be described in more detail with reference to FIG. 6A-B.

The connector(s) 26 (FIG. 1A) and the lid 32 comprise complementary reversibly interlocking features configured to interlock the lid 32 with the connectors 26 and to unlock the lid 32 from the connectors 26, as will be described in more detail with reference to FIGS. 5, 6A-B. The interlocking features of the lid 32 may comprise rectangular protrusions 36 extending from the base 38, each with a tapered edge. The interlocking features of the connectors 26 may comprise the receptacles 34 (FIG. 1A). The tapered edge of each protrusion 36 allows easier insertion of the protrusion 36 into the receptacle 34.

Figure 3:
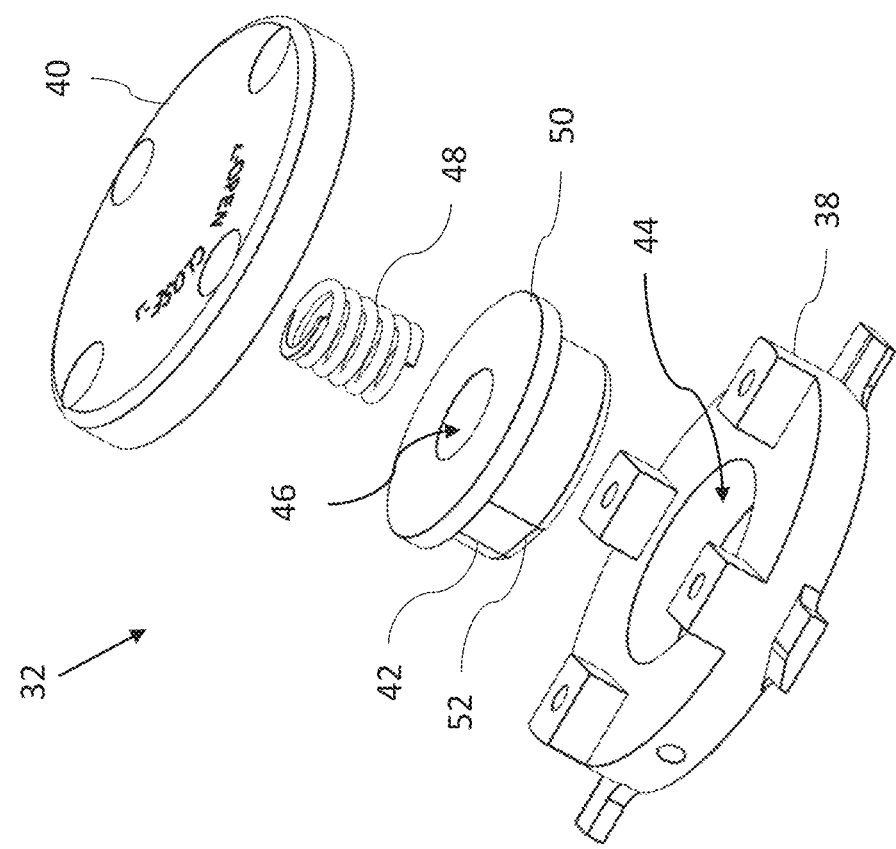
FIG. 3 is an exploded view of the lid of FIGS. 2A-B.

Reference is now made to FIG. 3, which is an exploded view of the lid 32 of FIGS. 2A-B. The base 38 and the cover 40 hold the piston 42 in a hollow 44 created by the base 38. The piston 42 includes a hollow 46 for disposing a spring 48 therein. The spring is compressed between a base of the hollow 46 and the cover 40 so that the piston 42 functions as a spring-loaded piston. When the lid 32 is assembled, the spring pushes the piston 42 downwards in the hollow 44 of the base 38, so that a lower section 52 of the piston 42 extends partially below the hollow 44. The piston 42 includes an upper section 50, which is wider than the lower section 52, to prevent the piston 42 from falling out of the base 38. The base 38 and the cover 40 include screw holes to enable connecting the base 38 with the cover 40. Additionally, or alternatively, the base 38 may be connected to the cover 40 using a suitable adhesive.

The lid 32 may be formed from any suitable material, for example, a metal such as steel or aluminum, or a carbon-based or ceramic-based material, or any suitable combination thereof, which is strong enough to withstand the temperatures used during the second reflow process (e.g., 260 degrees Centigrade).

Figure 4C:
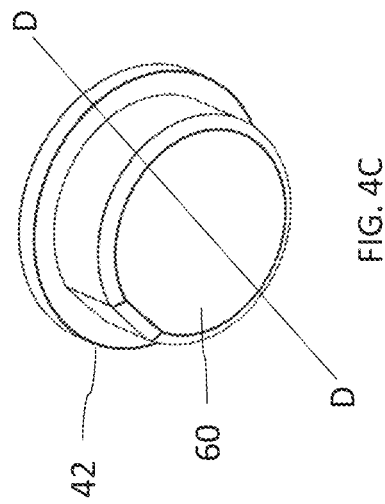
FIG. 4C is a schematic view of a spring-load piston of FIGS. 2A-B.
Figure 4D:
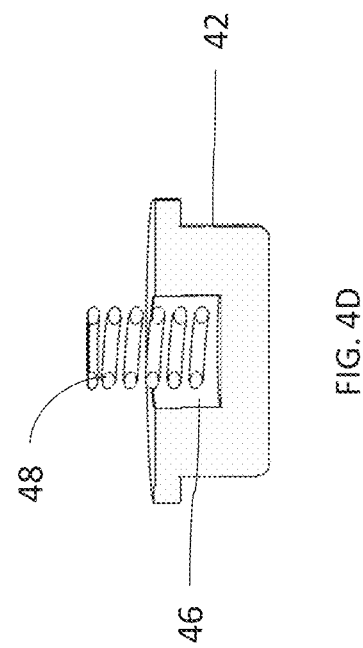
FIG. 4D is a cross-sectional view of the spring-loaded piston along line D:D of FIG. 4C.
Figure 4A:
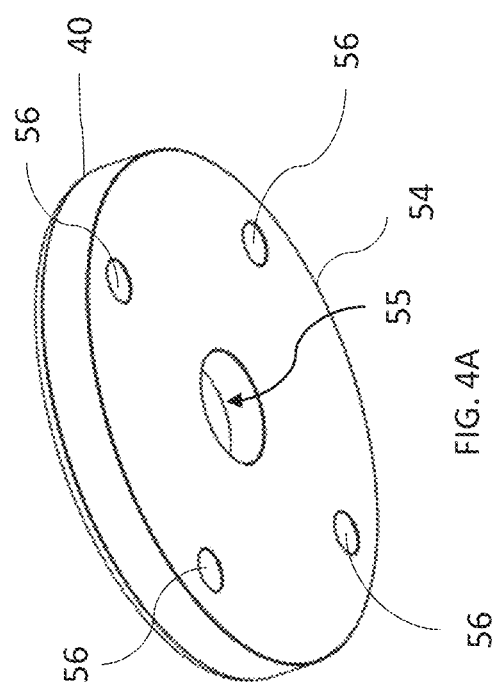
FIG. 4A is a schematic view of a cover of the lid of FIGS. 2A-B.

Reference is now made to FIG. 4A, which is a schematic view of the cover 40 of the lid 32 of FIGS. 2A-B. FIG. 4A shows a lower surface 54 of the cover 40 with four holes 56 therein for inserting screws for connecting the cover 40 to the base 38 (FIG. 3). The cover 40 includes a hollow 55 therein to accept an upper section of the spring 48 (FIG. 3) to prevent traverse movement of the spring 48.

Figure 4B:
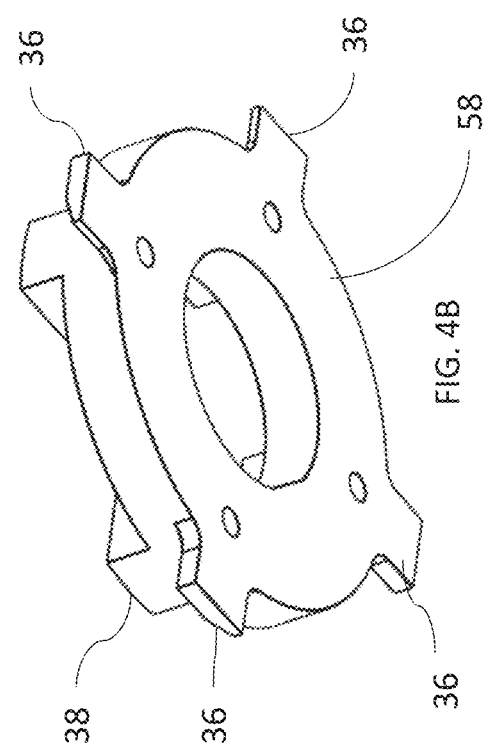
FIG. 4B is a schematic view of a base of the lid of FIGS. 2A-B.

Reference is now made to FIG. 4B, which is a schematic view of the base 38 of the lid 32 of FIGS. 2A-B. FIG. 4B provides a view of a lower surface 58 of the base 38. The protrusions 36 extend from the lower surface 58 and are level with the lower surface 58 in the embodiment shown in FIG. 4B. In some embodiments, the protrusions 36 may not be level with the lower surface 58.

Reference is now made to FIGS. 4C and 4D. FIG. 4C is a schematic view of the spring-load piston 42 of FIGS. 2A-B. FIG. 4D is a cross-sectional view of the spring-loaded piston 42 along line D:D of FIG. 4C. FIG. 4C shows a flat lower surface 60 of the piston 42. The lower surface 60 makes contact with the IC die 20 (FIG. 1A) when the lid 32 (FIG. 3) is interlocked with the connector(s) 26 (FIG. 1A). In some embodiments, the lower surface 60 may not be flat as long as the lower surface 60 applies a sufficient force on the IC die 20 during the second reflow process. FIG. 4D illustrates the positioning of the spring 48 in the hollow 46 of the piston 42. The spring is compressed by the cover 40 (FIG. 3) when the cover 40 is connected to the base 38 (FIG. 3) around the piston 42.

Figure 5A:
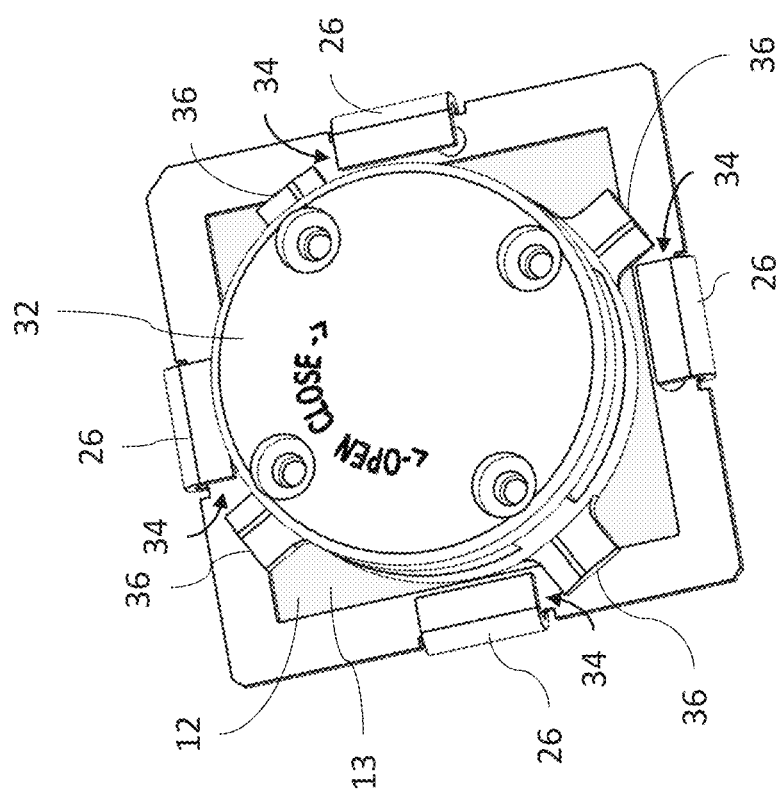
FIGS. 5A-B are schematic views of the lid of FIGS. 2A-B being interlocked with an IC package of the apparatus of FIG. 1A.
Figure 5B:
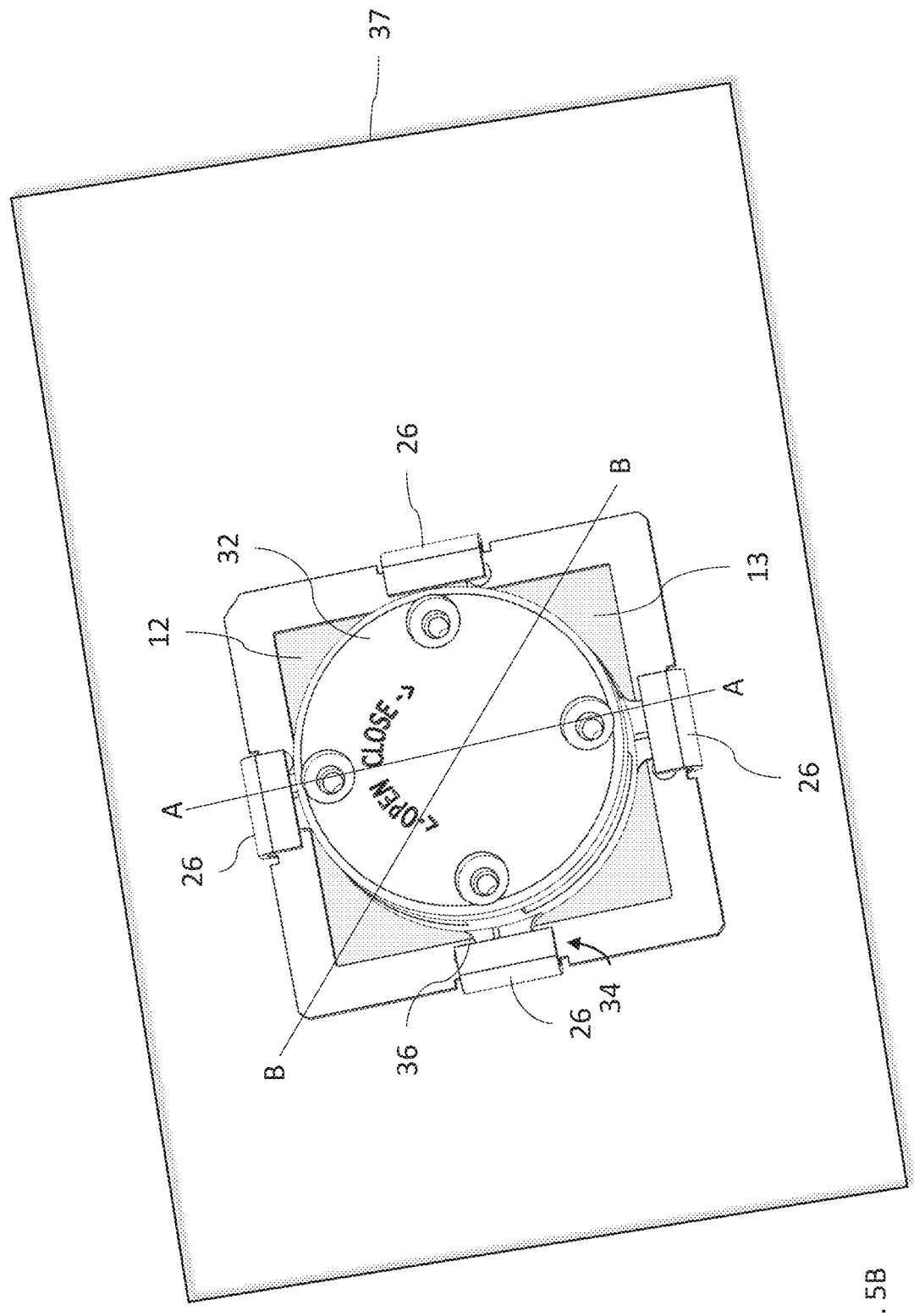

Reference is now made to FIGS. 5A-B, which are schematic views of the lid 32 of FIGS. 2A-B being interlocked with the IC package 13 of FIG. 1A. As previously mentioned, the connector(s) 26 and the lid 32 comprise complementary reversibly interlocking features (e.g., the receptacles 34 (only some labeled for the sake of simplicity) and the protrusions 36 (only some labeled for the sake of simplicity)) configured to interlock the lid 32 with the connector(s) 26 and unlock the lid 32 from the connector(s) 26. FIG. 5A shows the lid 32 placed on the substrate 12 in an unlocked position, while FIG. 5B shows the lid 32 interlocked with the connectors 26. In the embodiment shown in FIG. 5B, the interlocking features are configured to allow reversible connection of the lid 32 with the connector(s) 26 by rotating the lid 32 with respect to the connector(s) 26 in order to interlock the interlocking features together. FIG. 5B also shows the IC package 13 with the interlocked lid 32 placed on a printed circuit board 37, ready for the second reflow process.

Reference is now made to FIG. 6A, which is a cross-sectional view of the lid 32 interlocked with the IC package 13 along line A:A of FIG. 5B and placed on the printed circuit board 37. As previously mentioned, the lid 32 is configured to reversibly connect with the substrate 12 of the IC package 13 over the IC die 20 so that the lid 32 applies a force to the IC die 20 to at least partially reduce the warpage caused in the first reflow process. The lid is also configured to be removable from the substrate 12 after the second reflow process. FIG. 6A shows that the protrusions 36 are interlocked with the receptacles 34. The spring-loaded piston 42 is configured to apply a force, which is perpendicular to a plane defined by the substrate 12, on the IC die 20. The force is applied by the spring 48 which is compressed between the hollow 46 and the cover 40. The lid 32 may also contact and apply a force to more than one IC die 20 which may be disposed on the substrate 12 in some implementations.

The printed circuit board 37 includes an array of contact pads 16 (only one labeled for the sake of simplicity) shown in an inset 18, which depicts an enlarged view of part of the printed circuit board 37 and the substrate 12. The contact pads 16 are typically created during etching of a copper layer of the printed circuit board 37. The lower surface (opposite the surface connected to the IC die 20) of the substrate 12 includes an array of contact pads 22 (only one labeled for the sake of simplicity) and an array of bonding elements 24 (only one labeled for the sake of simplicity), for example, solder balls or any suitable heat-activated bonding elements, respectively disposed on the array of contact pads 22. The substrate 12 of the IC package 13 is placed on to the printed circuit board 12 with respective ones of the bonding elements 24 contacting respective ones of the contact pads 16. The second reflow process is then performed, thereby bonding the substrate 12 of the IC package 13 to the printed circuit board 37. After the second reflow process the lid 32 may be removed from the IC package 13.

Figure 6B:
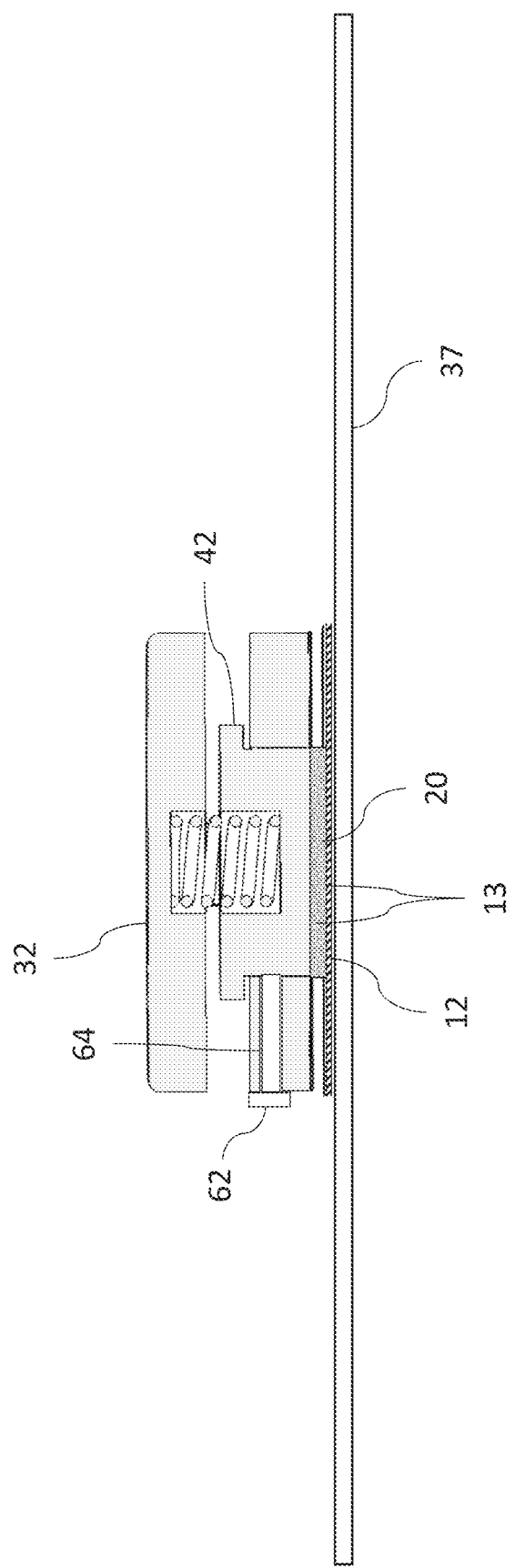
FIG. 6B is a cross-sectional view of the lid interlocked with the IC package along line B:B of FIG. 5B.

Reference is now made to FIG. 6B, which is a cross-sectional view of the lid 32 interlocked with the IC package 13 along line B:B of FIG. 5B. During the second reflow process, the spring-loaded piston 42 may continue to apply a downward force on the IC die 20 leading to warpage of the center of the substrate 12 in the downward direction. The lid 32 comprises a locking element 62 (e.g., a bolt) configured to lock a vertical position of the spring-loaded piston 42 after the lid 32 has been reversibly connected with the substrate 12 of the IC package 13. In some embodiments, the locking element 62 includes a screw thread 64 configured to adjust an abutment of the locking element 62 with the spring-loaded piston 42.

Reference is now made to FIG. 7, which is a flow chart 70 including steps in a method of manufacturing the electronic apparatus 10 (FIG. 1A) in accordance with an embodiment of the present invention. The method includes bonding (block 72) the IC die 20 (FIG. 1A) (FIG. 1A) to the substrate 12 (FIG. 1A) to form the IC package 13 (FIG. 1A) using a first reflow process, which causes the substrate 12 to warp. The method also includes affixing (block 74) the connector(s) 26 (FIG. 1A) and optionally the frame 14 (FIG. 1A) to the substrate 12. The step of block 74 may include bonding (block 76) the connector(s) 26 and/or the frame 14 to the substrate 12, for example using an epoxy-based adhesive, and heat-curing the epoxy-based adhesive.

The method also includes respectively disposing (block 78) the array of bonding elements 24 (FIG. 6A) on the array of contact pads 22 of the substrate 12 of the IC package 13 (FIG. 6A) using any suitable technique. The bonding elements 24 may be solder balls or any suitable heat-activated bonding elements.

The method includes reversibly connecting (block 80) the lid 32 (FIG. 6A) with the substrate 12 of the IC package 13 over the IC die 20 so that the lid 32 applies a force to the IC die 20. In some embodiments, the step of reversibly connecting includes the spring-loaded piston 42 of the lid 32 applying a force, which is perpendicular to a plane defined by the substrate 12, on the IC die 20. The reversibly connecting of block 78 includes a sub-step of interlocking (block 82) the lid 32 with the connector(s) 26 using complementary reversibly interlocking features (e.g., the receptacle 34 and the protrusions 36 of FIG. 6A) of the lid 32 and the connector(s) 26. In some embodiments, the interlocking includes rotating the lid 32 with respect to the connector(s) 26 in order to interlock the interlocking features together.

The method includes optionally locking (block 84) a position of the spring-loaded piston 42 after the lid 32 has been connected with the substrate 12 of the IC package 13, for example. By using the locking element 62 of FIG. 6B.

The method includes placing (block 86) the substrate 12 of the IC package 13 on to the printed circuit board 37 (FIG. 6A) with respective ones of the bonding elements 24 contacting respective ones of the contact pads 16 (FIG. 6A) of the printed circuit board 37.

The method then includes performing (block 88) the second reflow process to apply heat to the bonding elements 24 to bond the contact pads 16 with the contact pads 22; then unlocking (block 90) the lid 32 from the connector(s) 26; and removing (block 92) the lid 32 from the substrate 12 of the IC package 13 after the second reflow process.

Figure 8:
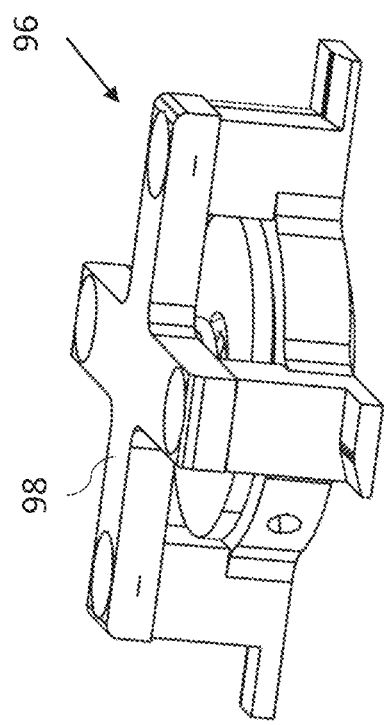
FIG. 8 is a schematic view of a lid constructed and operative in accordance with an alternative embodiment of the present invention.
Figure 9B:
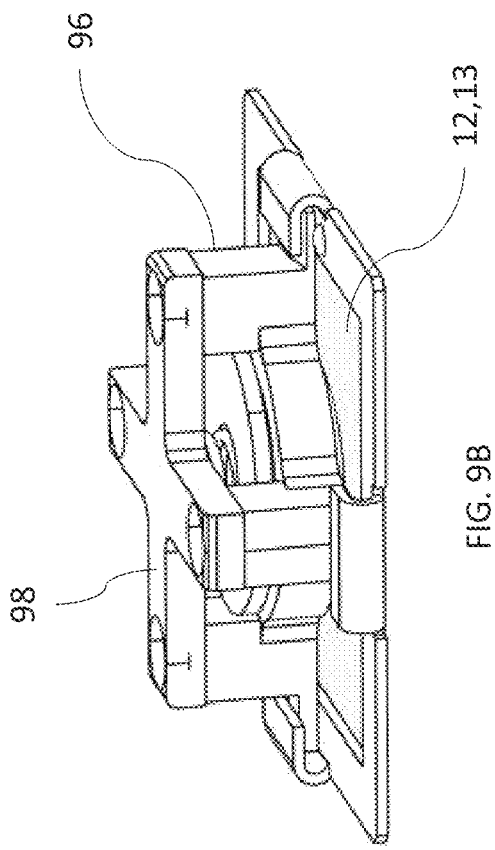
FIGS. 9A-B are schematic views of the lid of FIG. 8 interlocked with the IC package of the apparatus of FIG. 1A.
Figure 9A:
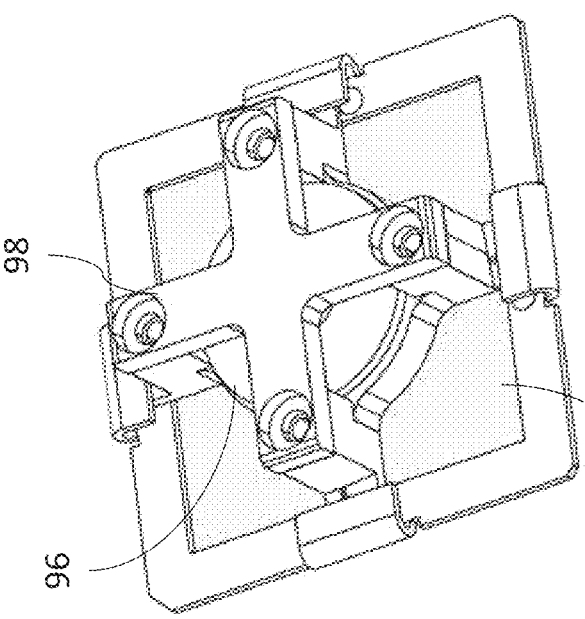
Figure 11:
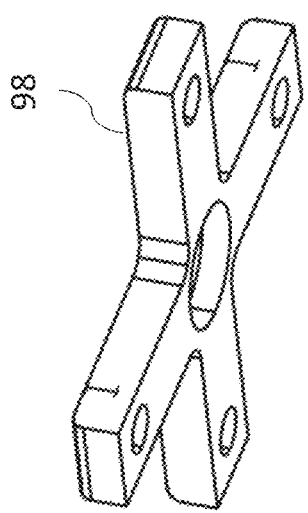
FIG. 11 is a schematic view of a cover of the lid of FIG. 8.
Figure 10:
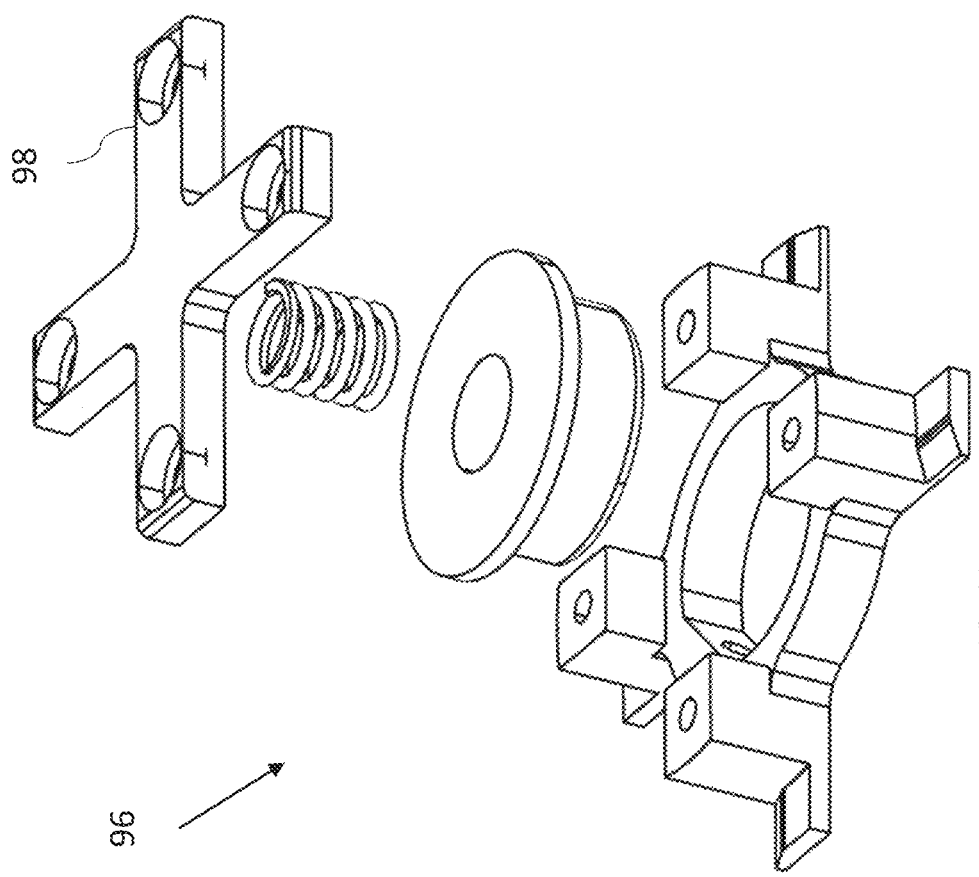
FIG. 10 is an exploded view of the lid of FIG. 8.

Reference is now made to FIGS. 8-11. FIG. 8 is a schematic view of a lid 96 constructed and operative in accordance with an alternative embodiment of the present invention. FIGS. 9A-B are schematic views of the lid 96 of FIG. 8 interlocked with the IC package 13 of FIG. 1A. FIG. 10 is an exploded view of the lid 96 of FIG. 8. FIG. 11 is a schematic view of a cover 98 of the lid 96 of FIG. 8. The lid 96 is substantially the same as the lid 32 of FIGS. 2-6B except that the cover 40 is replaced with the cover 98, which has a cross-shape. The cover 98 allows quicker heating of the IC die 20 (FIG. 1A) during the second reflow process due to the reduced material used in the cover 98 compared with the cover 40.

Figure 12:
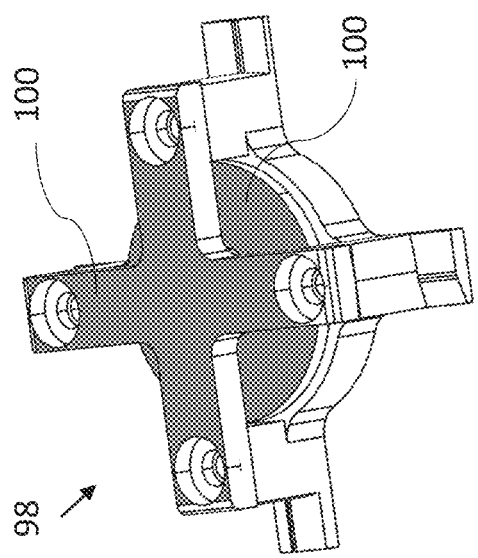
FIG. 12 is a schematic view of the lid of FIG. 8 partially painted with a black paint.

Reference is now made to FIG. 12, which is a schematic view of the lid 96 of FIG. 8 partially painted with a black paint 100. The lid 96 may include a surface or surfaces which are at least partially painted with a paint which is darker than the surface to provide better heat absorption during the second reflow process. In some embodiments, all the outer surfaces of the lid 96 may be painted in a darker or black paint.

Various features of the invention which are, for clarity, described in the contexts of separate embodiments may also be provided in combination in a single embodiment. Conversely, various features of the invention which are, for brevity, described in the context of a single embodiment may also be provided separately or in any suitable sub-combination.

The embodiments described above are cited by way of example, and the present invention is not limited by what has been particularly shown and described hereinabove. Rather the scope of the invention includes both combinations and subcombinations of the various features described hereinabove, as well as variations and modifications thereof which would occur to persons skilled in the art upon reading the foregoing description and which are not disclosed in the prior art.

What is claimed is:

1. An electronic apparatus, comprising:
   a printed circuit board (PCB) with an array of first contact pads;
   an integrated circuit (IC) package comprising an IC die bonded to a substrate, which is warped, the substrate including an array of second contact pads and an array of bonding elements respectively disposed on the array of second contact pads, the IC package being placed on to the PCB with respective ones of the bonding elements contacting respective ones of the first contact pads;
   a removable lid configured to: reversibly connect with the IC package over the IC die so that the removable lid applies a force to the IC die to at least partially reverse warpage of the substrate; and be removed from the IC package; and
   at least one connector affixed to the substrate, wherein the at least one connector and the lid comprise complementary reversibly interlocking features configured to: interlock the lid with the at least one connector; and unlock the lid from the at least one connector.

2. The apparatus according to claim 1, wherein the complementary reversibly interlocking features include protrusions and receptacles, the protrusions being configured to interlock with the receptacles.

3. The apparatus according to claim 1, further comprising a frame including the at least one connector.

4. The apparatus according to claim 1, wherein the interlocking features are configured to allow reversible connection of the lid with the at least one connector by rotating the lid with respect to the at least one connector in order to interlock the interlocking features together.

5. The apparatus according to claim 1, wherein the at least one connector is bonded to the substrate.

6. The apparatus according to claim 5, wherein the at least one connector is bonded to the substrate using an epoxy-based adhesive.

7. The apparatus according to claim 1, wherein the lid comprises a spring-loaded piston configured to apply the force, which is perpendicular to a plane defined by the substrate, on the IC die.

8. The apparatus according to claim 7, wherein the lid comprises a locking element configured to lock a position of the spring-loaded piston after the lid has been reversibly connected with the substrate.

9. The apparatus according to claim 8, wherein the locking element includes a screw thread configured to adjust an abutment of the locking element with the spring-loaded piston.

10. The apparatus according to claim 1, wherein the lid includes a surface which is at least partially painted with a paint which is darker than the surface.

11. A method comprising, comprising:
    providing a printed circuit board (PCB) with an array of first contact pads;
    bonding an integrated circuit (IC) package comprising an IC die to a substrate, which is warped, the substrate including an array of second contact pads and an array of bonding elements respectively disposed on the array of second contact pads, the substrate also including at least one connector affixed thereto;
    placing the IC package on to the PCB with respective ones of the bonding elements contacting respective ones of the first contact pads;
    reversibly connecting a removable lid with the IC package over the IC die so that the removable lid applies a force to the IC die to at least partially reverse warpage of the substrate, the reversibly connecting including interlocking the removable lid with the at least one connector using complementary reversibly interlocking features comprised in the at least one connector and the removable lid; and
    removing the removable lid from the IC package.

* * * * *